(12) United States Patent
Dalmia

(10) Patent No.: US 11,024,574 B2
(45) Date of Patent: Jun. 1, 2021

(54) INTEGRATED SUBSTRATE COMMUNICATION FRONTEND

(71) Applicant: INTEL CORPORATION, Santa Clara, CA (US)

(72) Inventor: Sidharth Dalmia, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/077,732

(22) PCT Filed: Mar. 15, 2016

(86) PCT No.: PCT/US2016/022476
§ 371 (c)(1),
(2) Date: Aug. 13, 2018

(87) PCT Pub. No.: WO2017/160281
PCT Pub. Date: Sep. 21, 2017

(65) Prior Publication Data
US 2019/0027432 A1    Jan. 24, 2019

(51) Int. Cl.
*H01L 23/522* (2006.01)
*H01L 23/00* (2006.01)

(52) U.S. Cl.
CPC ............ *H01L 23/522* (2013.01); *H01L 24/13* (2013.01); *H01L 2224/131* (2013.01); *H01L 2224/16225* (2013.01); *H01L 2224/73204* (2013.01); *H01L 2924/15311* (2013.01); *H01L 2924/19105* (2013.01)

(58) Field of Classification Search
CPC . H01L 23/522; H01L 24/13; H01L 2224/131; H01L 2224/16225; H01L 2224/73204; H01L 2924/15311; H01L 2924/19105
See application file for complete search history.

(56) References Cited

U.S. PATENT DOCUMENTS

| 5,543,764 A | 8/1996 | Turunen et al. |
| 2007/0290929 A1* | 12/2007 | Noro ........................ H01Q 1/38 343/700 MS |

(Continued)

FOREIGN PATENT DOCUMENTS

WO    2015142591    9/2015

OTHER PUBLICATIONS

International Search Report and Written Opinion for International Patent Application No. PCT/US2016/022474, dated Dec. 6, 2016.

(Continued)

*Primary Examiner* — Fernando L Toledo
*Assistant Examiner* — Neil R Prasad
(74) *Attorney, Agent, or Firm* — Green, Howard & Mughal LLP.

(57) ABSTRACT

Described is an apparatus which comprises: a die with a first side; a first set of solder balls coupled to the die along the first side; a laminate based substrate adjacent to the first set of solder balls, the laminate based substrate having at least one balun, at least one bandpass filter (BPF), and at least one diplexer embedded in the laminate, wherein the at least one balun is communicatively coupled to the first die via at least one of the solder balls of the first set.

22 Claims, 8 Drawing Sheets

(56) References Cited

U.S. PATENT DOCUMENTS

| | | |
|---|---|---|
| 2008/0258838 A1 | 10/2008 | Oshima |
| 2009/0184779 A1 | 7/2009 | Cho et al. |
| 2009/0219908 A1* | 9/2009 | Rofougaran ......... H04B 1/0057 370/343 |
| 2010/0091752 A1* | 4/2010 | Kemmochi .............. H03H 7/09 370/339 |
| 2010/0135193 A1* | 6/2010 | Przadka ................. H04B 1/406 370/297 |
| 2011/0304012 A1* | 12/2011 | Kim ........................ H01L 21/56 257/531 |
| 2012/0133561 A1 | 5/2012 | Konanur et al. |
| 2013/0113117 A1 | 5/2013 | Haralabidis et al. |
| 2015/0054511 A1 | 2/2015 | Apostolos et al. |
| 2015/0131248 A1* | 5/2015 | Dakhiya ............... H05K 3/4697 361/761 |
| 2015/0222300 A1* | 8/2015 | Schmidhammer ........ H04L 5/14 370/278 |
| 2015/0280651 A1* | 10/2015 | Uzunkol ............... H03F 1/0211 330/295 |
| 2015/0303974 A1 | 10/2015 | Domino |
| 2016/0150649 A1* | 5/2016 | Peng ................. H01L 23/49822 361/761 |

OTHER PUBLICATIONS

International Search Report and Written Opinion for International Patent Application No. PCT/US2016/022477, dated Dec. 1, 2016.
International Preliminary Report on Patentability for International Patent Application No. PCT/US16/22474, dated Sep. 27, 2018.
International Preliminary Report on Patentability for International Patent Application No. PCT/US16/22476, dated Sep. 27, 2018.
International Preliminary Report on Patentability for International Patent Application No. PCT/US16/22477, dated Sep. 27, 2018.
International Search Report and Written Opinion for International Patent Application No. PCT/US2016/022476, dated Nov. 21, 2016.

* cited by examiner

INTEGRATED SUBSTRATE COMMUNICATION FRONTEND

CLAIM OF PRIORITY

This Application is a National Stage Entry of, and claims priority to, PCT Application No. PCT/US16/22476, filed on 15 Mar. 2016 and titled "INTEGRATED SUBSTRATE COMMUNICATION FRONTEND," which is incorporated by reference in its entirety for all purposes.

BACKGROUND

The Radio Frequency (RF) frontend and discrete silicon passive components (e.g., inductors, antennas, capacitors, etc.) can occupy approximately 50% to 70% area of a platform (e.g., a circuit board of a handheld phone). The frontend can cost approximately 30% to 50% of the total Bill of Materials (BOM), and increase power consumption by approximately 10% to 20%. Currently RF designs use discrete components from commonly made using Low Temperature Co-fired Ceramic (LTCC) processes. However, LTCC is very expensive and challenging for use in space constrained cost sensitive applications.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
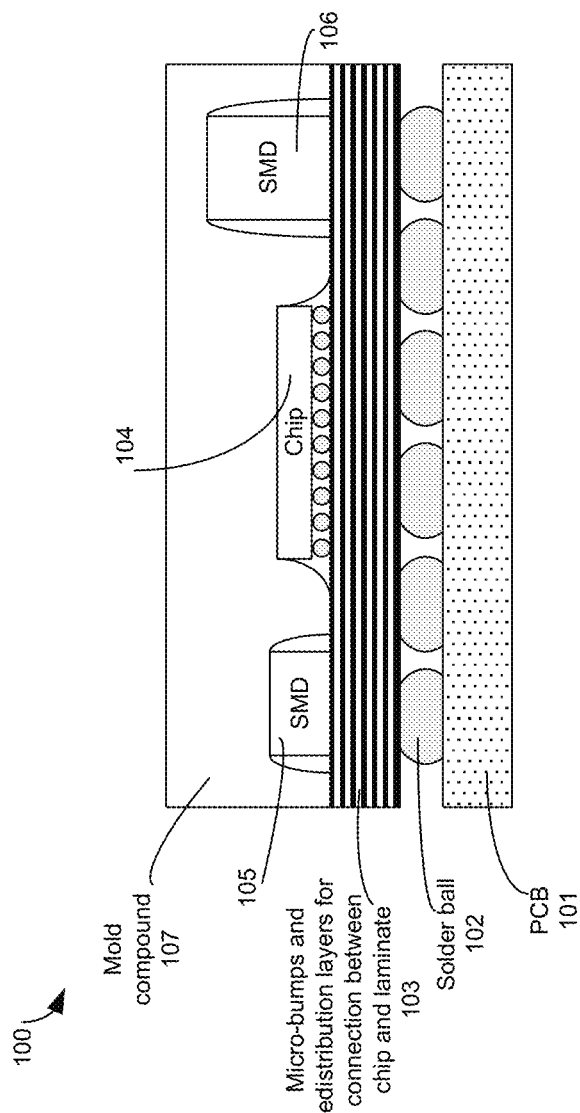
FIG. 1 illustrates a cross-section of a computing platform with standalone components of a radio frequency (RF) frontend positioned on the surface of a laminate.

FIG. 1 illustrates cross-section 100 of a computing platform (e.g., a circuit board of a handheld phone) with standalone components of a radio frequency (RF) frontend positioned on the surface of a laminate. Cross-section 100 comprises a printed circuit board (PCB) 101, solder balls 102, laminate or substrate 103 with micro-bumps and redistribution layer, RF active and passive devices 104 (e.g., wireless chip), surface mount devices (SMDs) 105 and 106, and mold compound 107. SMDs 105 and 106 may include frontend components such as baluns, antennas, diplexers, multiplexers, filters (e.g., bandpass and low pass filers), etc. These SMDs perform important functions. For example, baluns are used for eliminating common mode noise, diplexers and multiplexers allow for antenna sharing, and bandpass/low-pass filters reject unwanted signals and blockers. As more frequency bands are added to computing platforms to provide additional services, the number of components grows further. These components, however, can occupy approximately 50% to 70% area of the platform and can cost approximately 30% to 50% of the total Bill of Materials (BOM).

Some embodiments describe an integrated substrate frontend (iSFE) formed by printing the SMDs and other components in the packaging substrates (e.g., laminates) or host PCB. As such, savings in lateral area and height of the platform are realized. Additionally, a highly integrated computing platform is achieved.

Some embodiments describe an apparatus (e.g., a computing platform) which comprises a die (e.g., processor die) with a first side and a first set of solder balls coupled to the die along the first side. The apparatus further comprises a laminate based substrate adjacent to the first set of solder balls, the laminate based substrate having at least one balun, at least one bandpass filter (BPF), and at least one diplexer embedded in the substrate, wherein the at least one balun is communicatively coupled to the first die via at least one of the solder balls of the first set. Here, the laminate forms the iSFE. Depending on the layer count available, the iSFE portion can be directly underneath the die too, in accordance with some embodiments.

Some embodiments describe an apparatus that includes a signal generator which is to provide signals on first, second, and third frequency bands or higher number of bands. For example, the signal generator provides signals on 2.4 GHz band, 5 GHz band, and GNSS (Global Navigation Satellite System) band. In some embodiments, the apparatus further comprises a balanced diplexer which is coupled to the signal generator, where the balanced diplexer is operable to diplex signals on the first and second frequency bands. In some embodiments, a first antenna is provided which coupled to the balanced diplexer. In some embodiments, the apparatus further comprises a balanced triplexer coupled to the signal generator, where the balanced triplexer is operable to multiplex signals on the first, second, and third frequency bands; and a second antenna coupled to the balanced triplexer. In other embodiments, the multiplexer could also provide the other bands at millimeter wave frequencies (e.g., frequencies greater than 10 GHz) for IF (Intermediate Frequency) and radio frequencies related to 5G and WIGig (Wireless Gigabit Alliance) applications.

The iSFE of various embodiments is lower in cost than any known integration schemes such as Low Temperature Co-fired Ceramic (LTCC) processes or IPD (Integrated Passive Device) on SOI (Silicon-on-Insulator) or high resistivity Si (Silicon) or higher cost laminate packages. The iSFE of various embodiments can be customized to silicon (Si) as standalone component or integrated in Si package or in PCB on which the Si resides.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 2:
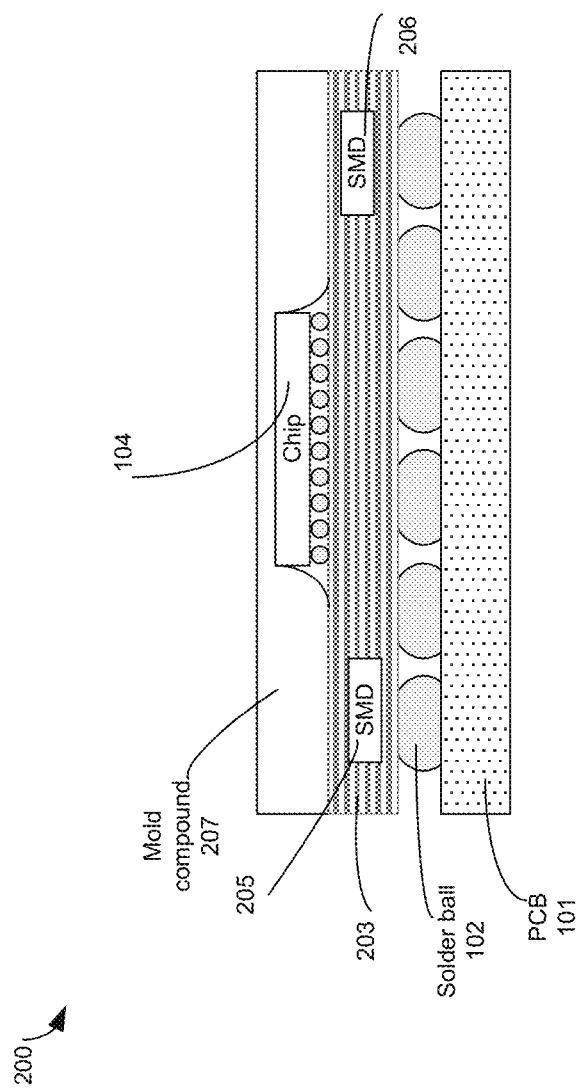
FIG. 2 illustrates a cross-section of a computing platform with integrated components of a RF frontend within a laminate or substrate, according to some embodiments of the disclosure.

FIG. 2 illustrates cross-section 200 of a computing platform with integrated components of a RF frontend within a laminate or substrate, according to some embodiments of the disclosure. It is pointed out that those elements of FIG. 2 having the same reference numbers (or names) as the elements of any other figure can operate or function in any manner similar to that described, but are not limited to such.

Cross-section 200 illustrates laminate 203 with integrated SMDs 205 and 206. Compared to cross-section 100, here BoM is reduced because discrete components 105 and 106 are no longer needed as standalone components and are fully integrated into laminate 203 forming fully iSFE. In some embodiments, laminate 203 uses standard silicon package substrate technology with minimum layer counts (e.g., less than 5 layers) and integrating/printing the functionality of the entire frontend in substrate 203. Laminate based substrate 203 of the various embodiments is manufactured at low cost using traditional schemes such as core base or coreless substrates. The laminate based substrate 203 of the various embodiments is conducive for silicon package or standalone component with thin core and thin pre-impregnated layers. The laminate based substrate 203 of the various embodiments is also conducive for fan-out and for iSFE. In some embodiments, laminate 203 can have one metal layer as the minimum number of layers or multiple layers (e.g., at most five) depending on the availability of substrate thickness. In some embodiments, laminate based substrate 203 has a thickness which is less than 30 μm.

In some embodiments, when using a 1 layer or 1.5 layer laminate or low layer count, solder connections can be used instead of vias and the area underneath the device on main PCB can be used to draw portions of inductors and capacitors too. Although, FIG. 2 shows solder balls on top side and bottom side of substrate, it is understood that the solder balls can be replaced with a LGA (Land Grid Array) connection where the solder ball is replaced with regular SMT (Surface Mount Technology) connection. In some embodiments, Cu (Copper) pillars on top and bottom or one of the planes can use used. In some embodiments, the substrate can have cavity for the die alongside the integrated passive components.

By using the right combination of materials, thicknesses, design rules, and architecture, a complete WiFi, BT (Bluetooth), and a global navigation satellite system (GLASS) frontend can be implemented and integrated in substrate 203. As such, most if not all the standalone components around silicon chip 104 can be completely or near completely eliminated and the package can be made thinner, cheaper, smaller, and better performing. For example, the thickness of mold compound 207 is less than the thickness of mold compound 107, and as such package thickness (e.g., height) is reduced.

In some embodiments, laminate 203 includes an integrated balanced filter for each frequency band which can be connected to other balanced filters in other frequency band with minimal circuitry. As such, single ended antenna sharing or dipole antenna sharing across multiple bands is achieved in accordance with some embodiments. In some embodiments, dominant inductive and dominant parasitic capacitive designs are employed to integrate frontend components in ultra-thin substrate 103 and PCB 101 without additional processing costs and without the need for non-standard PCB/substrate materials. In some embodiments, laminate 203 can be made using microvias and through-holes or just one of the interconnects. In some embodiments, laminate 203 can be as minimal as two metal layers with one core/prepreg material. In some embodiments, the laminate based substrate is independent of microvias.

By using parasitic capacitances, minimal number of physical realizable components are used to achieve desired responses in-band and out-of-band. In some embodiments, no physical ground is used in the package itself. Instead, in some embodiments, the ground of the reference board is used to free up a metal layer of laminate 203 and/or PCB 101.

When using minimal number of metal layers or thin packaging substrates, it is understood that the presence of ground locally can add significant parasitics. While such parasitics are very useful, in certain instances they can also degrade the coupling between the mutually coupled inductors. In some embodiments, the main layers of the package may not have locally present ground around in certain areas. In some embodiments, several of the components in the schematics can be implemented using discrete components such as SMT bandpass filters, SMT capacitors and inductors or on Si capacitors and inductors. For example, some portions of the schematics are integrated as printed components on the substrate while others are embedded in laminate 203. In some embodiments, an odd number of layers are used in a coreless implementation of such substrate. When using minimal number of layers, the various embodiments also lends themselves extremely well for flexible/bendable electronics.

Figure 3:
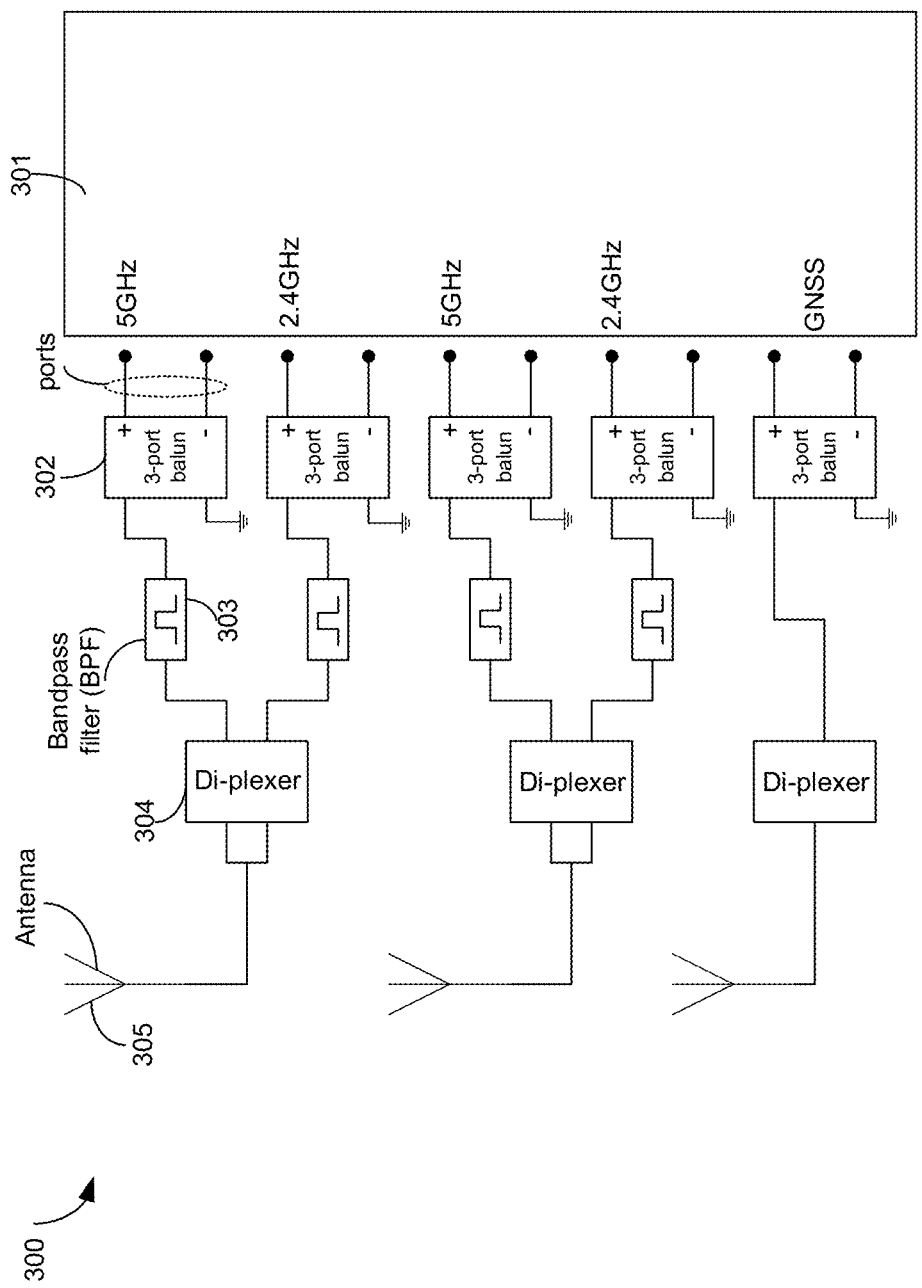
FIG. 3 illustrates a frontend of Global Positioning System (GPS) with WiFi and Bluetooth (BT) platform with sixteen components most of which are integrated in a laminate, according to some embodiments of the disclosure.

FIG. 3 illustrates frontend 300 of Global Positioning System (GPS) with WiFi and Bluetooth (BT) platform with sixteen standalone components, some of which are embedded in a laminate. This frontend includes signal generator 301, five baluns 302, four bandpass filters (BPFs) 303, three diplexers 304, and three antennas 305. The number grows larger for more complex frontends. For example, frontends those that use more bands multiplexed on to the same antenna or same RF cable from a M.2 card have more components that those illustrated above. In such applications a DC signal can also be supplied to the cable using BIAS-T configuration. In other embodiments, low frequency signals such as clock frequencies, read write (WRI) pulses, etc. can also be multiplexer using combination of single ended, differential filters and low pass, high pass, and bandpass filters.

Here, signal generator 301 is an integrated circuit that provides signals at different frequency bands (e.g., 5 GHz, 2.4 GHz, GNSS (Global Navigation Satellite System) compliant frequency, etc.) to balun 303. In some embodiments, signal generator 301 is implemented in chip 104. In some embodiments, balun 302 is a four port device (or effectively a 3-port device because one port is coupled to ground) and is an electrical device that converts between a balanced signal (e.g., two signals working against each other where ground is irrelevant) and an unbalanced signal (e.g., a single signal working against ground or pseudo-ground). The input ports of balun 302 are coupled to signal generator 301 and one of the output port is coupled to BPF 303 and another to ground. In some embodiments, balun 302 is embedded in laminate 203.

BPF 303 is a filter that passes frequencies within a certain range and rejects or attenuates frequencies outside of that range. It is generally implemented as a resistor-inductor-capacitor (RLC) circuit. In some embodiments, BPF 303 is embedded in laminate 203. The output of BPF 303 is received by diplexer 304.

In some embodiments, each diplexer 304 receives two inputs and diplexes them for a corresponding antenna coupled to that diplexer. Here, diplexer 304 is a passive device that implements frequency-domain multiplexing. Two ports (e.g., low frequency port and high frequency port) are multiplexed onto an output port. The low frequency port generally provides signals on a low frequency band (e.g., 2.4 GHz band) while the high frequency port generally provides signals on a high frequency band (e.g., 5 GHz). The signals on the low frequency port and the high frequency port occupy disjoint frequency bands. Accordingly, the signals on the low frequency port and the high frequency port can coexist on the output port without interfering with each other. In some embodiments, diplexer 304 is embedded in laminate 203. In some embodiments, the output port of diplexer 304 is coupled to a corresponding antenna 305.

Antenna 305 is one of: monopole antennas, dipole antennas, loop antennas, patch antennas, microstrip antennas, coplanar wave antennas, or other types of antennas suitable for transmission of Radio Frequency (RF) signals. In some multiple-input multiple-output (MIMO) embodiments, antenna array 305 are separated to take advantage of spatial diversity. In this example, 16 discrete components are needed for implementing GPS (Global Positioning System) frontend 300 with WiFi and BT capabilities. In some embodiments, antenna 305 is embedded in laminate 203. While the embodiment of FIG. 3 illustrates differential balun 302, the design can be modified to use single-ended baluns without changes the scope of the embodiments such that the single-ended baluns are embedded in laminate 203.

Figure 4:
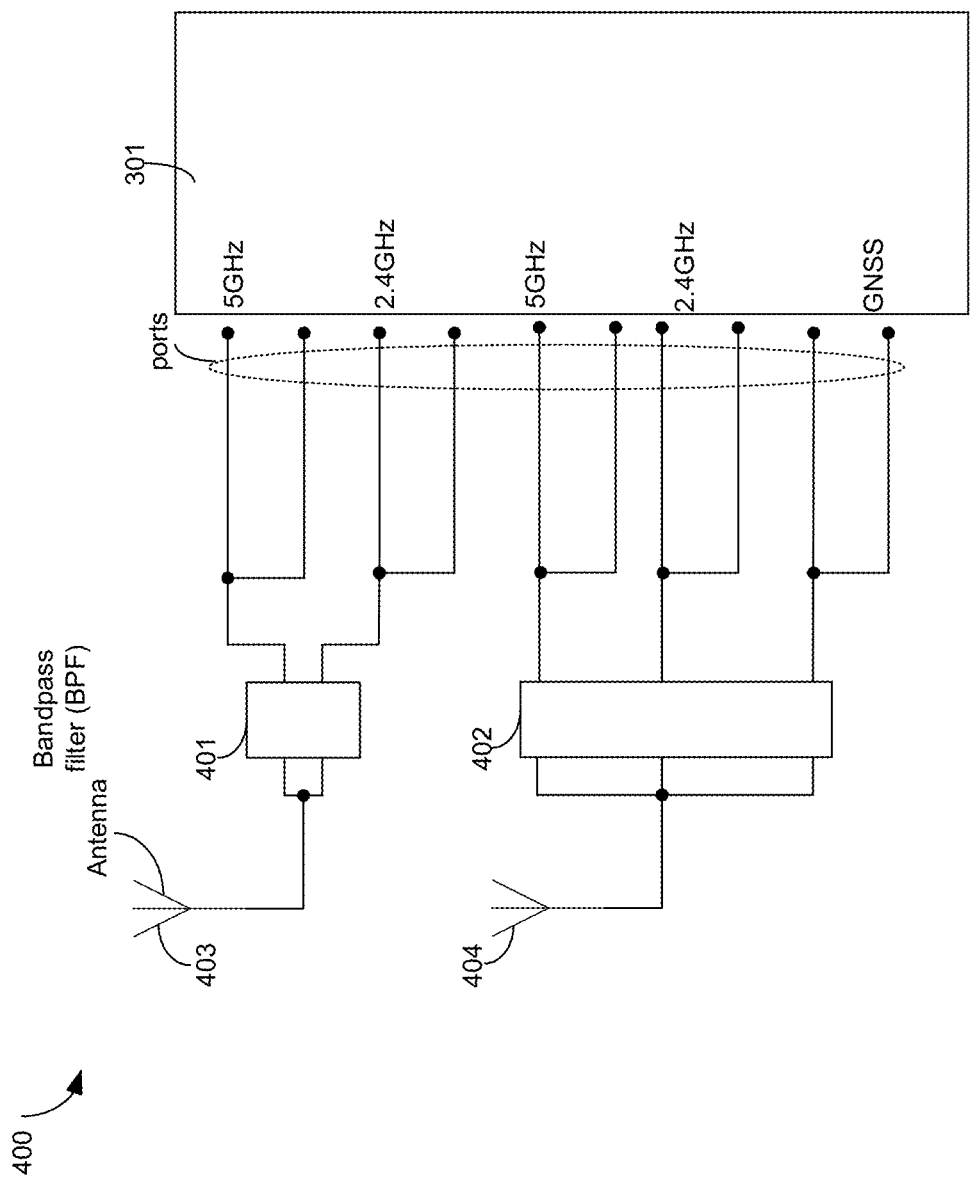
FIG. 4 illustrates a modified frontend of GPS with WiFi/BT platform with four standalone components, according to some embodiments of the disclosure.

FIG. 4 illustrates a modified frontend 400 of a GPS with WiFi/BT platform with four standalone components, according to some embodiments of the disclosure. It is pointed out that those elements of FIG. 4 having the same reference numbers (or names) as the elements of any other figure can operate or function in any manner similar to that described, but are not limited to such.

In some embodiments, frontend 400 comprises wireless logic module 301, balance diplexer 401, balanced triplexer 402, and antennas 403 and 404. Compared to frontend 400, here total five components are used. The lower count of components reduces the cost of BoM. In some embodiments, balance diplexer 401 and balanced triplexer 402 allow for single ended antenna sharing or dipole antenna sharing across multiple bands.

In some embodiments, balance diplexer 401 includes few passive devices which are organized to perform functions of a balun, diplexer, and bandpass filter. As such, one balance diplexer 401 is a multi-functional component which uses fewer passive devices than having standalone balun, diplexer, and bandpass filters. While the embodiment of FIG. 4 illustrates a differential balanced diplexer, single-ended balanced diplexers can also be formed. In some embodiments, balance diplexer 401 comprises four input ports, where two ports are for a high frequency band (e.g., 5 GHz) while two ports are for low frequency band (e.g., 2.4 GHz). In some embodiments, the output of balance diplexer 401 is a dual port output which is merged (or summed) together at one node coupled to antenna 403. In some embodiments, antenna 403 is formed in laminate 203. In some embodiments, antenna 403 is formed outside of laminate 203.

In some embodiments, antenna 403 is a multiband antenna. In some embodiments, antenna 403 is one of: monopole antennas, dipole antennas, loop antennas, patch antennas, microstrip antennas, coplanar wave antennas, or other types of antennas suitable for transmission of RF signals. In some MIMO embodiments, antenna array 403 are separated to take advantage of spatial diversity. In some embodiments, balanced diplexer 401, balanced triplexer 402, and antennas 402 and 404 are embedded in laminate 203. In some embodiments, some or all components are embedded in laminate 203 such that signal generator 301 is above laminate while other components are embedded in laminate 203 and/or positioned above laminate 203.

Figure 5:
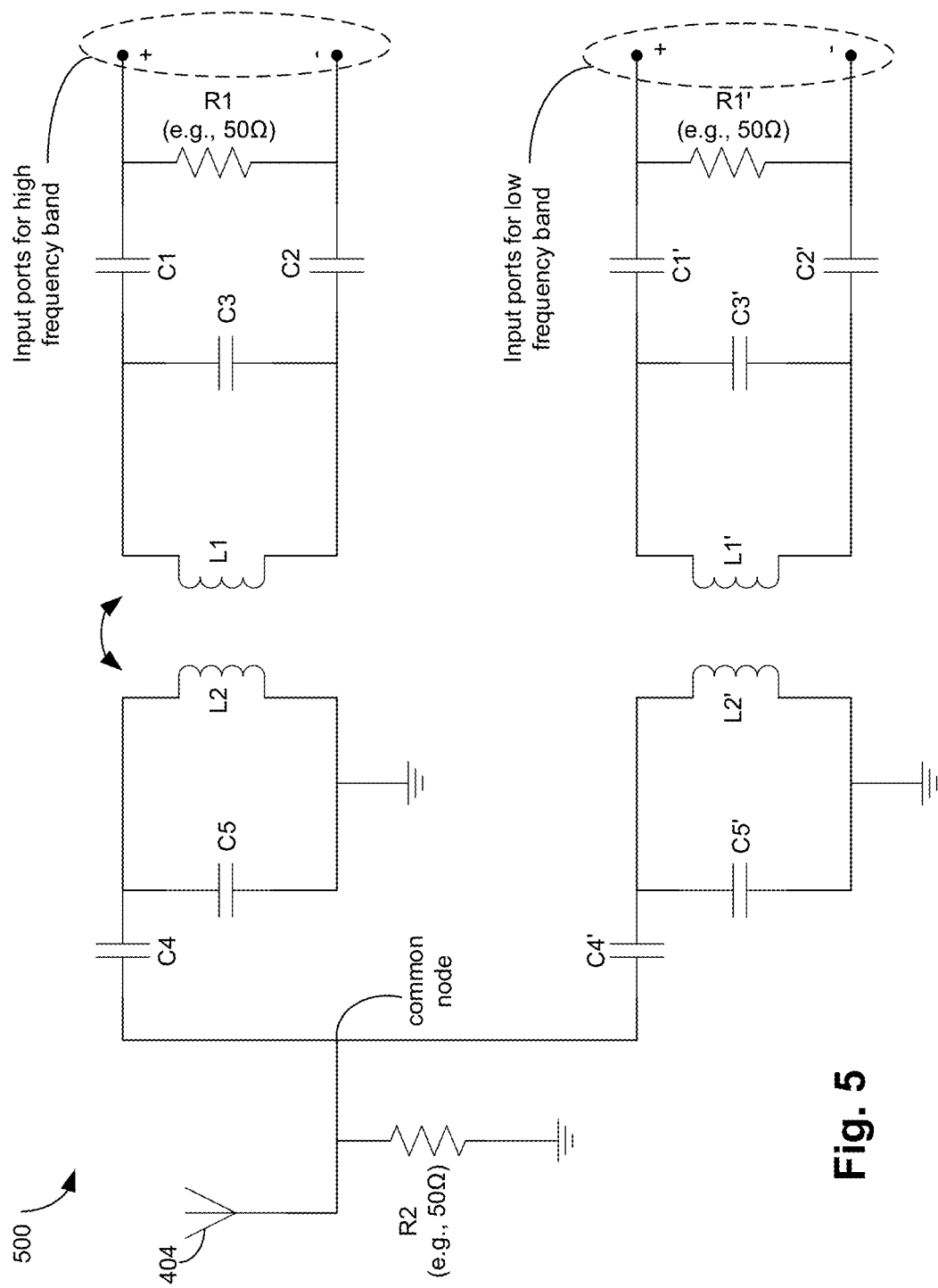
FIG. 5 illustrates a differential balanced filter or balanced diplexer with integrated balun, diplexer, and bandpass filter, according to some embodiments of the disclosure.

FIG. 5 illustrates a differential balanced filter or balanced diplexer 500 (e.g., 401) with integrated balun, diplexer, and bandpass filter, according to some embodiments of the disclosure. It is pointed out that those elements of FIG. 5 having the same reference numbers (or names) as the elements of any other figure can operate or function in any manner similar to that described, but are not limited to such.

In some embodiments, balanced diplexer 500 comprises a first differential path, a second differential path, and a common node coupling the first and second differential paths to antenna 403. In some embodiments, balanced diplexer 500 includes an output impedance (e.g., 50 Ohms) matched to the input impedance of antenna 403. In some embodiments, first differential path comprises differential input impedance R1 (e.g., 50 Ohms), capacitors C1, C2, C3, C3, and C5, and inductors L1 and L2.

In some embodiments, differential input impedance R1 is provided by a resistor having a first terminal coupled to one input port (e.g., '+' port) and another terminal coupled to another input port (e.g., '+' port). In some embodiments, capacitor C1 has a first terminal coupled to the input port and the first terminal of resistor R1. In some embodiments, the second terminal of capacitor C1 is coupled to a first terminal of inductor L1. In some embodiments, capacitor C2 has a first terminal coupled to the input port and the second terminal of resistor R1. In some embodiments, the second terminal of capacitor C2 is coupled to a second terminal of inductor L1. In some embodiments, capacitor C3 is coupled in parallel to inductor L1. In some embodiments, inductor L1 is inductively coupled to inductor L2. In some embodiments, a first terminal of inductor L2 is coupled to a first terminal of capacitor C4 and a first terminal of capacitor C5. In some embodiments, a second terminal of inductor L2 is coupled to ground. In some embodiments, capacitor C5 is coupled in parallel to inductor L2. In some embodiments, a second terminal of capacitor C4 is coupled to the common node. In some embodiments, an output impedance (e.g., a 50 Ohms resistor R2) is coupled to the common node. In some embodiments, inductors L1 and L2 together function as a balun. In some embodiments, the first and second differential paths provide the diplexer function of apparatus 500

The differential design of FIG. 5 uses coupled inductor topology where inductor L2 (and L2') is single-ended whereas inductor L1 (and L1') provide differential signal, in accordance with some embodiments. In some embodiments, the inductor coupling for each frequency band is tailored to meet the desired bandwidth. In some embodiments, the capacitors C3 and C5 of the first differential path which are parallel to inductors L1 and L2, respectively, provide the desired frequency pole for the first differential path. In some embodiments, the capacitors C3' and C5' of the second differential path, which are parallel to inductors L1' and L2', respectively, provide the desired frequency pole for the second differential path. In some embodiments, the series capacitors C1, C2, and C4 for the first differential path match to the desired impedance (e.g., 25-100 Ohms).

In some embodiments, the series capacitors C1', C2', and C4' for the second differential path match to the desired impedance (e.g., 25 Ωs to 100 Ωs). In other embodiments, to match Si power amplifiers directly, the differential or single ended impedance can be as low as 1-10 Ohms with some reactance. In some such embodiments, a portion of circuitry may be implemented on the Si (silicon) itself. For example, capacitors and capacitor banks can be implemented in silicon itself where impedance and frequency tenability is also achieved.

In some embodiments, the filters can connect together without the need for additional matching, phasing, and multiplexing phasors at the common node. In some embodiments, inductors L1, L2, L1', and L2' are large (e.g., the range can be 0.5 nH to 30 nH) whereas capacitors (C1, C2, C3, C4, C5, C1', C2', C3', C4', and C5') are small (e.g., in the range of 0.01 pF to 5 pF) so that diplexer 300 can be realized in a small size using standard PCB and packaging dielectrics.

In some embodiments, the second differential path has a similar structure and layout (or floorplan) as the first differential path but with different capacitors and inductors (e.g., different values of capacitances and inductances). Here, the second differential path comprises differential input impedance R1' (e.g., 50 Ohms), capacitors C1', C2', C3', C4', and C5', and inductors L1' and L2'.

In some embodiments, lower frequency band (e.g., 2.4 GHz) produces a very high input impedance at the input ports of the upper band (e.g., 5 GHz) while the upper frequency band (e.g., 5 GHz) provides a very high impedance at the input ports of the lower band (e.g., 2.5 GHz). As such, signals on the first and second differential paths remain separate and avoid interference. The common node provides a single-ended port to a multiband antenna (e.g., antenna 403), in accordance with some embodiments.

Figure 6:
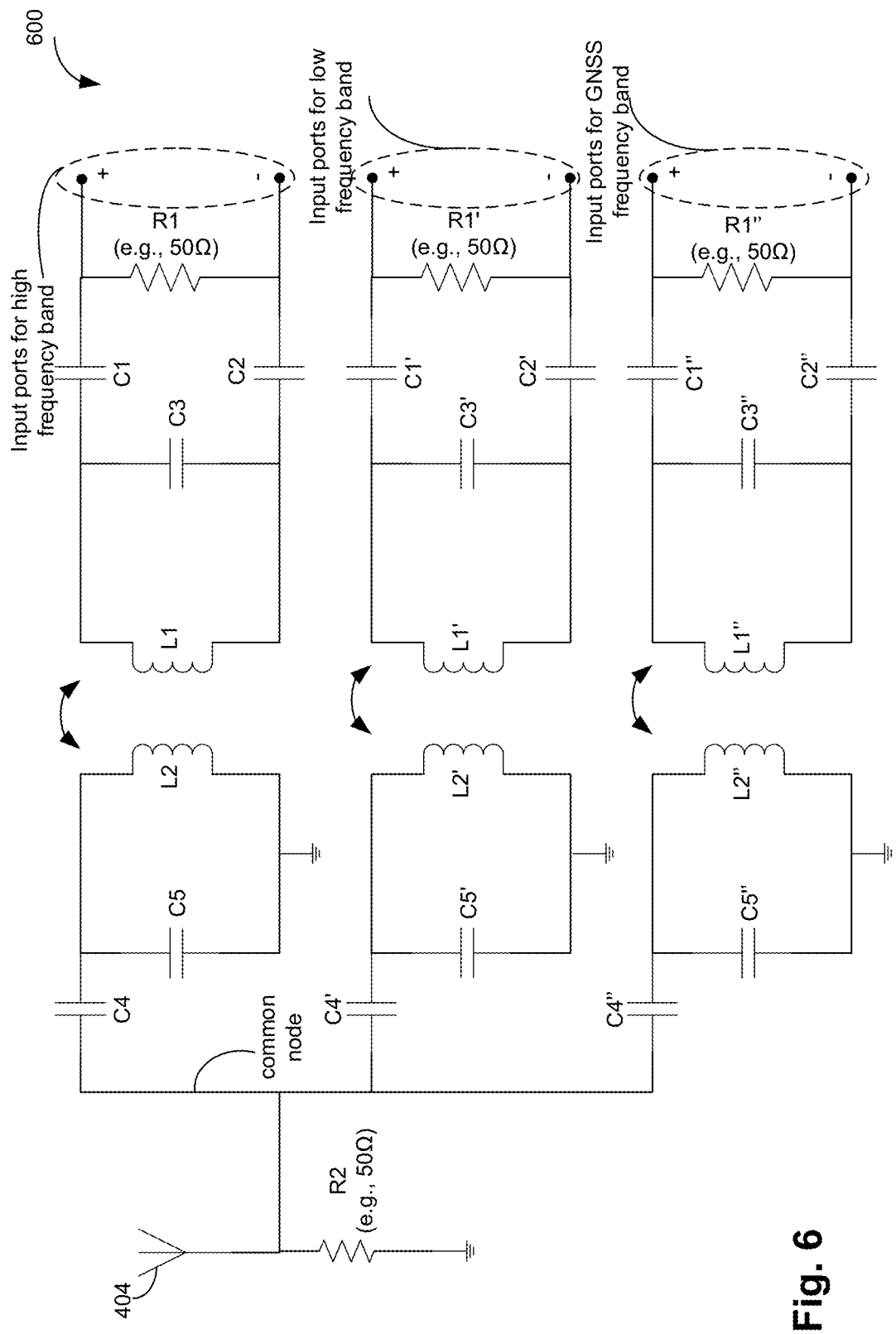
FIG. 6 illustrates a differential balanced multiplexer or triplexer with integrated balun, multiplexer/triplexer, and bandpass filter, according to some embodiments of the disclosure.

FIG. 6 illustrates a differential balanced multiplexer or triplexer 600 (e.g., 402) with integrated balun, multiplexer/triplexer, and bandpass filter, according to some embodiments of the disclosure. It is pointed out that those elements of FIG. 6 having the same reference numbers (or names) as the elements of any other figure can operate or function in any manner similar to that described, but are not limited to such. So as not to obscure the embodiments of the disclosure, differences between FIG. 6 and FIG. 3 are described.

Here, in addition to the first and second differential paths, a third differential path is added which comprises differential input impedance R1" (e.g., 50 Ohms), capacitors C1", C2", C4", C3", and C5", and inductors L1" and L2". In this example, the ports for the third differential path receive GNSS frequency band. Functionally, resistor R1", capacitors C1", C2", C4", C3", and C5", and inductors L1" and L2" of the third differential path behave same as resistor R1, capacitors C1, C2, C3, C4, and C5, and inductors L1 and L2 of the first differential path.

In some embodiments, lower frequency band (e.g., 2.4 GHz) produces a very high input impedance at the input ports of the first differential path (e.g., upper band of 5 GHz) and the third differential path (e.g., GNSS frequency band). In some embodiments, the upper frequency band (e.g., 5 GHz) provides a very high impedance at the input ports of the second differential path (e.g., lower band of 2.5 GHz) and the third differential path (e.g., GNSS frequency band). In some embodiments, the GNSS frequency band provides a very high impedance at the input ports of the first differential path (e.g., higher band of 5 GHz) and the second differential path (e.g., lower band of 2.5 GHz). As such, signals on the first, second, and third differential paths remain separate and avoid interference. The common node provides a single-ended port to a multiband antenna (e.g., antenna 301), in accordance with some embodiments.

Figure 7:
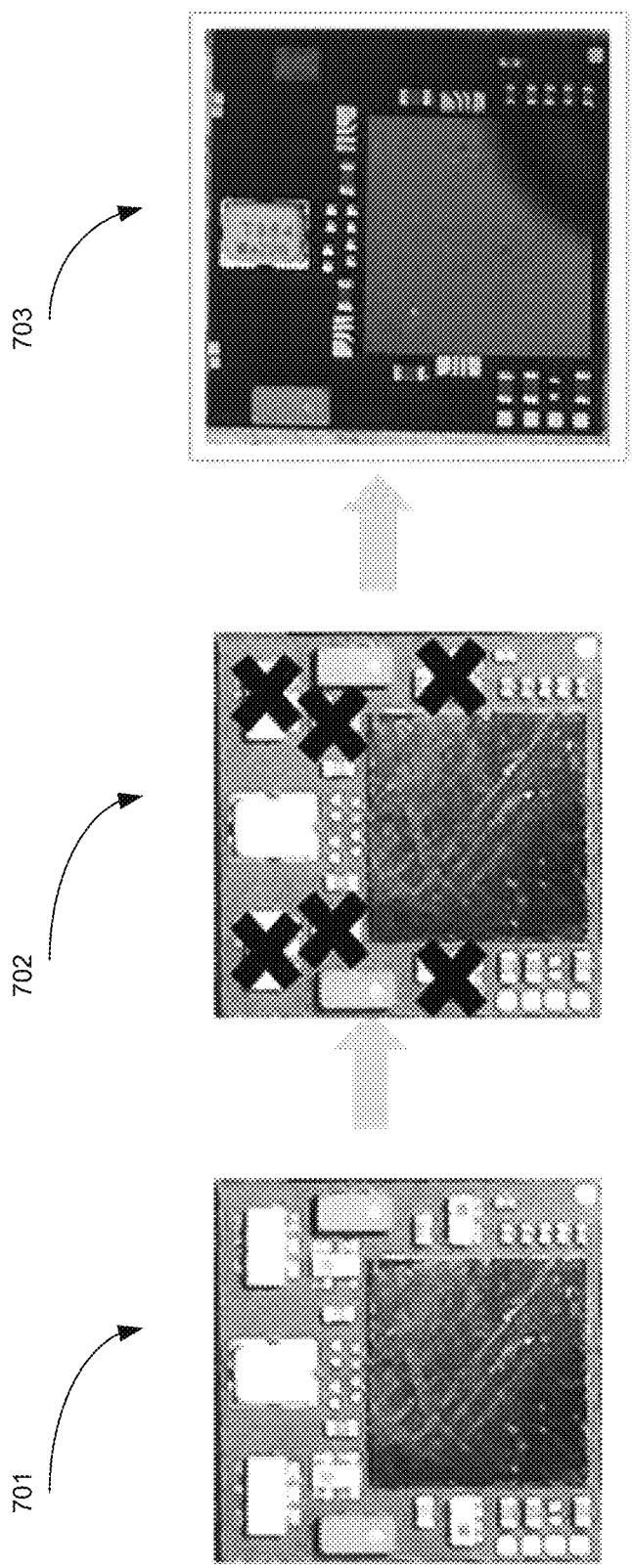
FIG. 7 illustrates a view of a RF frontend on top of a laminate and an integrated substrate RF frontend with fewer standalone components, according to some embodiments of the disclosure.

FIG. 7 illustrates view 700 of an RF frontend on top of laminate 103/203 and an integrated substrate/laminate 203 RF frontend with fewer standalone components, according to some embodiments of the disclosure. Here, view 700 is a top view of FIG. 1 with the RF frontend (e.g., balun, bandpass filter, diplexer, triplexer, etc.) located on top of laminate 103. View 701 identifies various frontend components (see 'X' mark) that can be integrated in laminate 103/203. View 702 is a top view of FIG. 2 with the RF frontend integrated in substrate or laminate 103/203.

Figure 8:
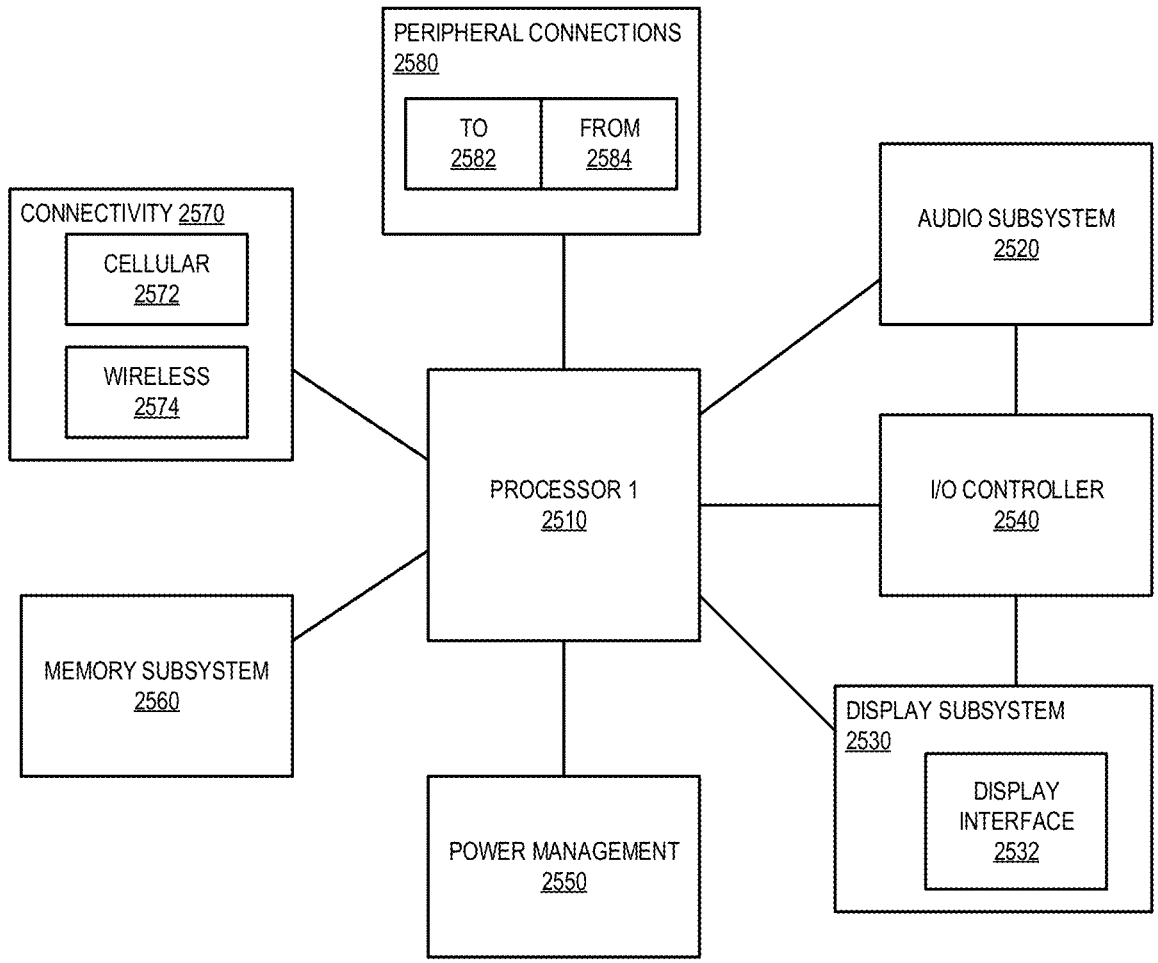
FIG. 8 illustrates a smart device or a computer system or a SoC (System-on-Chip) which is partially implemented in the laminate/substrate, according to some embodiments.

FIG. 8 illustrates a smart device or a computer system or a SoC (System-on-Chip) 2500 which is partially implemented in the laminate/substrate, according to some embodiments. It is pointed out that those elements of FIG. 8 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

FIG. 8 illustrates a block diagram of an embodiment of a mobile device in which flat surface interface connectors could be used. In some embodiments, computing device 2500 represents a mobile computing device, such as a computing tablet, a mobile phone or smart-phone, a wireless-enabled e-reader, or other wireless mobile device. It will be understood that certain components are shown generally, and not all components of such a device are shown in computing device 2500.

In some embodiments, computing device 2500 includes a first processor 2510 (e.g., die 104). The various embodiments of the present disclosure may also comprise a network interface within 2570 such as a wireless interface so that a system embodiment may be incorporated into a wireless device, for example, cell phone or personal digital assistant.

In one embodiment, processor 2510 can include one or more physical devices, such as microprocessors, application processors, microcontrollers, programmable logic devices, or other processing means. The processing operations performed by processor 2510 include the execution of an operating platform or operating system on which applications and/or device functions are executed. The processing operations include operations related to I/O (input/output) with a human user or with other devices, operations related to power management, and/or operations related to connecting the computing device 2500 to another device. The processing operations may also include operations related to audio I/O and/or display I/O.

In one embodiment, computing device 2500 includes audio subsystem 2520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2500, or connected to the computing device 2500. In one embodiment, a user interacts with the computing device 2500 by providing audio commands that are received and processed by processor 2510.

Display subsystem 2530 represents hardware (e.g., display devices) and software (e.g., drivers) components that provide a visual and/or tactile display for a user to interact with the computing device 2500. Display subsystem 2530 includes display interface 2532, which includes the particular screen or hardware device used to provide a display to a user. In one embodiment, display interface 2532 includes logic separate from processor 2510 to perform at least some processing related to the display. In one embodiment, display subsystem 2530 includes a touch screen (or touch pad) device that provides both output and input to a user.

I/O controller 2540 represents hardware devices and software components related to interaction with a user. I/O controller 2540 is operable to manage hardware that is part of audio subsystem 2520 and/or display subsystem 2530. Additionally, I/O controller 2540 illustrates a connection point for additional devices that connect to computing device 2500 through which a user might interact with the system. For example, devices that can be attached to the computing device 2500 might include microphone devices, speaker or stereo systems, video systems or other display devices, keyboard or keypad devices, or other I/O devices for use with specific applications such as card readers or other devices.

As mentioned above, I/O controller 2540 can interact with audio subsystem 2520 and/or display subsystem 2530. For example, input through a microphone or other audio device can provide input or commands for one or more applications or functions of the computing device 2500. Additionally, audio output can be provided instead of, or in addition to display output. In another example, if display subsystem 2530 includes a touch screen, the display device also acts as an input device, which can be at least partially managed by I/O controller 2540. There can also be additional buttons or switches on the computing device 2500 to provide I/O functions managed by I/O controller 2540.

In one embodiment, I/O controller 2540 manages devices such as accelerometers, cameras, light sensors or other environmental sensors, or other hardware that can be included in the computing device 2500. The input can be part of direct user interaction, as well as providing environmental input to the system to influence its operations (such as filtering for noise, adjusting displays for brightness detection, applying a flash for a camera, or other features).

In one embodiment, computing device 2500 includes power management 2550 that manages battery power usage, charging of the battery, and features related to power saving operation. Memory subsystem 2560 includes memory devices for storing information in computing device 2500. Memory can include nonvolatile (state does not change if power to the memory device is interrupted) and/or volatile (state is indeterminate if power to the memory device is interrupted) memory devices. Memory subsystem 2560 can store application data, user data, music, photos, documents, or other data, as well as system data (whether long-term or temporary) related to the execution of the applications and functions of the computing device 2500.

Elements of embodiments are also provided as a machine-readable medium (e.g., memory 2560) for storing the computer-executable instructions. The machine-readable medium (e.g., memory 2560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2570 includes hardware devices (e.g., wireless and/or wired connectors and communication hardware) and software components (e.g., drivers, protocol stacks) to enable the computing device 2500 to communicate with external devices. The computing device 2500 could be separate devices, such as other computing devices, wireless access points or base stations, as well as peripherals such as headsets, printers, or other devices.

Connectivity 2570 can include multiple different types of connectivity. To generalize, the computing device 2500 is illustrated with cellular connectivity 2572 and wireless connectivity 2574. Cellular connectivity 2572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2574 refers to wireless connectivity that is not cellular, and can include personal area networks (such as Bluetooth, Near Field, etc.), local area networks (such as Wi-Fi), and/or wide area networks (such as WiMax), or other wireless communication. In some embodiments, various frontend components of the cellular connectivity 2574 such as antennas, baluns, diplexers, triplexers, multiplexers, bandpass filters, low pass filters, etc. are implemented as iSFE.

Peripheral connections 2580 include hardware interfaces and connectors, as well as software components (e.g., drivers, protocol stacks) to make peripheral connections. It will be understood that the computing device 2500 could both be a peripheral device ("to" 2582) to other computing devices, as well as have peripheral devices ("from" 2584) connected to it. The computing device 2500 commonly has a "docking" connector to connect to other computing devices for purposes such as managing (e.g., downloading and/or uploading, changing, synchronizing) content on computing device 2500. Additionally, a docking connector can allow computing device 2500 to connect to certain peripherals that allow the computing device 2500 to control content output, for example, to audiovisual or other systems.

In addition to a proprietary docking connector or other proprietary connection hardware, the computing device 2500 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a die with a first side; a first set of solder balls coupled to the die along the first side; and a laminate based substrate adjacent to the first set of solder balls, the laminate based substrate having at least one balun, at least one bandpass filter (BPF), and at least one diplexer embedded in the laminate, wherein the at least one balun is communicatively coupled to the first die via at least one of the solder balls of the first set. In some embodiments, the at least one balun is one of a differential input balun or a single-ended input balun.

In some embodiments, the at least one balun is coupled to the at least one BPF. In some embodiments, the at least one BPF is coupled to the at least one diplexer. In some embodiments, the laminate based substrate has less than five layers. In some embodiments, the laminate based substrate has a thickness which is less than 30 µm. In some embodiments, the apparatus: a second set of solder balls adjacent to the laminate based substrate; and a printed circuit board (PCB) adjacent to the second set of solder balls. In some embodiments, the PCB has metal lines with spacing less than 50 µm between the metal lines. In some embodiments, the laminate based substrate is independent of a ground plane.

In another example, a system is provided which comprises: a memory; an apparatus coupled to the memory, the apparatus according to the apparatus described above; and one or more antennas communicatively coupled to the apparatus.

In another example, an apparatus is provided which comprises a signal generator to provide signals on first, second, and third frequency bands; a balanced diplexer coupled to the signal generator, the balanced diplexer operable to diplex signals on the first and second frequency bands; a first antenna coupled to the balanced diplexer; a balanced triplexer coupled to the signal generator, the balanced triplexer operable to multiplex signals on the first, second, and third frequency bands; and a second antenna coupled to the balanced triplexer.

In some embodiments, at least one of the balanced diplexer balanced triplexer includes: a balun, a diplexer, and a bandpass filter. In some embodiments, the balanced diplexer comprises: a first differential transmission path for the first frequency band; a second differential transmission path for the second frequency band different from the first frequency band; and a node common to the first and second differential transmission paths, the node to be coupled to the first antenna. In some embodiments, an input impedance of the first differential transmission path is to be higher for the second frequency band than an input impedance of the second differential transmission path at the second frequency band, and wherein frequency of the first frequency band is higher than a frequency of the second frequency band.

In some embodiments, an input impedance of the second differential transmission path is to be higher for the first frequency band than an input impedance of the first differential transmission path at the first frequency band, and wherein frequency of the first frequency band is higher than a frequency of the second frequency band. In some embodiments, the balanced triplexer comprises: a first differential transmission path for the first frequency band; a second differential transmission path for the second frequency band different from the first frequency band; a third differential transmission path for the third frequency band different from the first and second frequency bands; and a node common to the first, second, and third differential transmission paths, the node to be coupled to the second antenna.

In some embodiments, at least one of the balanced diplexer and balanced triplexer is embedded in a laminate based substrate. In some embodiments, the laminate based substrate is independent of a ground plane. In some embodiments, the laminate based substrate has less than five layers. In some embodiments, the laminate based substrate has a thickness which is less than 30 μm.

In another example, a system is provided which comprises: a memory; a processor coupled to the memory; a first set of solder balls coupled to the processor along a first side of the processor; and a laminate based substrate adjacent to the first set of solder balls, the laminate based substrate having an apparatus according to the apparatus described above.

In another example, a method is provided which comprises: coupling a first set of solder balls to a die along a first side of the die; and positioning a laminate based substrate adjacent to the first set of solder balls, the laminate based substrate having at least one balun, at least one bandpass filter (BPF), and at least one diplexer embedded in the laminate, wherein the at least one balun is communicatively coupled to the first die via at least one of the solder balls of the first set. In some embodiments, the at least one balun is one of a differential input balun or a single-ended input balun.

In some embodiments, the at least one balun is coupled to the at least one BPF. In some embodiments, the at least one BPF is coupled to the at least one diplexer. In some embodiments, the laminate based substrate has less than five layers. In some embodiments, the laminate based substrate has a thickness which is less than 30 μm. In some embodiments, the method coupling a second set of solder balls adjacent to the laminate based substrate; and positioning a printed circuit board (PCB) adjacent to the second set of solder balls. In some embodiments, the PCB has metal lines with spacing less than 50 μm between the metal lines. In some embodiments, the laminate based substrate is independent of a ground plane.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a die with a side, wherein the die includes a signal generator;
   a set of solder balls coupled to the die along the side; and
   a substrate adjacent to the set of solder balls, the substrate having at least one balun, at least one bandpass filter (BPF), and at least one diplexer fully embedded in the substrate, wherein the at least one balun is communicatively coupled to the die via at least one solder balls of the set of solder balls, wherein the signal generator is to provide one or more signals to the at least one diplexer, and wherein the one or more signals are on first, second, and/or third frequency bands.

2. The apparatus of claim 1, wherein the at least one balun is one of a differential input balun or a single-ended input balun.

3. The apparatus of claim 1, wherein the at least one balun is coupled to the at least one BPF.

4. The apparatus of claim 1, wherein the at least one BPF is coupled to the at least one diplexer.

5. The apparatus of claim 1, wherein the substrate has less than five layers.

6. The apparatus of claim 1, wherein the substrate has a thickness which is less than 30 μm.

7. The apparatus of claim 1, wherein the set of solder balls is a first set of solder balls, and wherein the apparatus comprises:
   a second set of solder balls adjacent to the substrate; and
   a printed circuit board (PCB) adjacent to the second set of solder balls.

8. The apparatus of claim 7, wherein the PCB includes metal lines with spacing less than 50 μm between the metal lines.

9. The apparatus of claim 1, wherein the substrate is independent of a ground plane.

10. An apparatus comprising:
    a signal generator to provide signals on first, second, and third frequency bands;
    a balanced diplexer coupled to the signal generator, wherein the balanced diplexer is operable to diplex signals on the first and second frequency bands;

a first antenna coupled to the balanced diplexer;
a balanced triplexer coupled to the signal generator, wherein the balanced triplexer is operable to multiplex signals on the first, second, and third frequency bands; and
a second antenna coupled to the balanced triplexer.

11. The apparatus of claim 10, wherein at least one of the balanced diplexer or balanced triplexer includes: a balun, a diplexer, and a bandpass filter.

12. The apparatus of claim 10, wherein the balanced diplexer comprises:
a first differential transmission path for the first frequency band;
a second differential transmission path for the second frequency band different from the first frequency band; and
a node common to the first and second differential transmission paths, the node to be coupled to the first antenna.

13. The apparatus of claim 12, wherein an input impedance of the first differential transmission path is to be higher for the second frequency band than an input impedance of the second differential transmission path at the second frequency band, and wherein frequency of the first frequency band is higher than a frequency of the second frequency band.

14. The apparatus of claim 12, wherein an input impedance of the second differential transmission path is to be higher for the first frequency band than an input impedance of the first differential transmission path at the first frequency band, and wherein frequency of the first frequency band is higher than a frequency of the second frequency band.

15. The apparatus of claim 10, wherein the balanced triplexer comprises:
a first differential transmission path for the first frequency band;
a second differential transmission path for the second frequency band different from the first frequency band;
a third differential transmission path for the third frequency band different from the first and second frequency bands; and
a node common to the first, second, and third differential transmission paths, the node to be coupled to the second antenna.

16. The apparatus of claim 10, wherein at least one of the balanced diplexer or balanced triplexer is embedded in a laminate-based substrate.

17. The apparatus of claim 16, wherein the laminate-based substrate is independent of a ground plane.

18. The apparatus of claim 16, wherein the laminate-based substrate has less than five layers.

19. The apparatus of claim 16, wherein the laminate-based substrate has a thickness which is less than 30 µm.

20. A system comprising:
a memory;
a processor coupled to the memory;
a set of solder balls coupled to the processor along a side of the processor; and
a laminate-based substrate adjacent to the set of solder balls, the laminate-based substrate having an apparatus which comprises:
a signal generator to provide signals on first, second, and third frequency bands;
a balanced diplexer coupled to the signal generator, wherein the balanced diplexer is operable to diplex signals on the first and second frequency bands;
a first antenna coupled to the balanced diplexer;
a balanced triplexer coupled to the signal generator, wherein the balanced triplexer is operable to multiplex signals on the first, second, and third frequency bands; and
a second antenna coupled to the balanced triplexer.

21. The system of claim 20, wherein at least one of the balanced diplexer or balanced triplexer includes: a balun, a diplexer, and a bandpass filter.

22. The system of claim 20, wherein the balanced diplexer comprises:
a first differential transmission path for the first frequency band;
a second differential transmission path for the second frequency band different from the first frequency band; and
a node common to the first and second differential transmission paths, the node to be coupled to the first antenna.

* * * * *